US010222444B2

(12) United States Patent
Merfeld et al.

(10) Patent No.: US 10,222,444 B2
(45) Date of Patent: Mar. 5, 2019

(54) SYSTEMS AND METHODS FOR MOVING MAGNETIC RESONANCE IMAGING

(71) Applicants: Daniel Merfeld, Lincoln, MA (US); Jerome Ackerman, Newton, MA (US)

(72) Inventors: Daniel Merfeld, Lincoln, MA (US); Jerome Ackerman, Newton, MA (US)

(73) Assignees: The General Hospital Corporation, Boston, MA (US); Massachusetts Eye and Ear Infirmary, Boston, MA (US)

( * ) Notice: Subject to any disclaimer, the term of this patent is extended or adjusted under 35 U.S.C. 154(b) by 782 days.

(21) Appl. No.: 14/707,606

(22) Filed: May 8, 2015

(65) Prior Publication Data

US 2015/0323618 A1 Nov. 12, 2015

Related U.S. Application Data

(60) Provisional application No. 61/991,110, filed on May 9, 2014.

(51) Int. Cl.
*G01R 33/563* (2006.01)
*G01R 33/30* (2006.01)
*G01R 33/38* (2006.01)
*G01R 33/3875* (2006.01)
*G01R 33/3815* (2006.01)
*G01R 33/383* (2006.01)
(Continued)

(52) U.S. Cl.
CPC ..... *G01R 33/56383* (2013.01); *G01R 33/307* (2013.01); *G01R 33/3802* (2013.01); *G01R 33/3804* (2013.01); *G01R 33/3875* (2013.01); *G01R 33/56375* (2013.01); *G01R 33/383* (2013.01); *G01R 33/3815* (2013.01); *G01R 33/3873* (2013.01); *G01R 33/421* (2013.01); *G01R 33/4806* (2013.01)

(58) Field of Classification Search
CPC ............ G01R 33/56383; G01R 33/307; G01R 33/3802; G01R 33/3804; G01R 33/3875; G01R 33/56375
See application file for complete search history.

(56) References Cited

U.S. PATENT DOCUMENTS

| 5,304,934 A | * | 4/1994 | Laskaris | ............ G01R 33/3815 324/318 |
| 5,423,315 A | * | 6/1995 | Margosian | ............. A61B 5/055 324/309 |

(Continued)

FOREIGN PATENT DOCUMENTS

GB 2239523 A * 7/1991 ............. A01K 15/02

OTHER PUBLICATIONS

Heeswijk et al., Motion Compensation Strategies in Magnetic Resonance Imaging, Critical ReviewsTM in Biomedical Engineering, 40(2):99-119, 2012.*

(Continued)

*Primary Examiner* — Daniel Miller
(74) *Attorney, Agent, or Firm* — Quarles & Brady LLP

(57) ABSTRACT

A magnetic resonance imaging ("MRI") system that can be operated while a subject performs, experiences, or otherwise undergoes naturalistic motion. This movable MRI ("mMRI") system includes a magnet whose position and orientation can be changed while the subject is moving, such that the magnet and subject maintain a substantially fixed spatial relationship relative to each other.

20 Claims, 4 Drawing Sheets

(51) Int. Cl.
*G01R 33/3873* (2006.01)
*G01R 33/421* (2006.01)
*G01R 33/48* (2006.01)

(56) References Cited

U.S. PATENT DOCUMENTS

| | | | | |
|---|---|---|---|---|
| 6,135,924 | A * | 10/2000 | Gibbs | A63B 22/02 |
| | | | | 482/51 |
| 7,609,062 | B2 * | 10/2009 | Roland | A61B 5/0555 |
| | | | | 324/318 |
| 2003/0094947 | A1 * | 5/2003 | Akgun | A61B 5/055 |
| | | | | 324/309 |
| 2010/0237867 | A1 * | 9/2010 | Slade | G01R 33/3873 |
| | | | | 324/314 |
| 2015/0346298 | A1 * | 12/2015 | Jonas | A61B 5/0555 |
| | | | | 324/322 |

OTHER PUBLICATIONS

Brig. Gen. Joselito Payumo Avancena tours USNS Mercy during PP15 (USNS Mercy), Aug. 20, 2015.*
Mercy Ships Sail to Third World Countries to Deliver Care (Mercy Ships), Jul. 2015.*

* cited by examiner

SYSTEMS AND METHODS FOR MOVING MAGNETIC RESONANCE IMAGING

CROSS-REFERENCE TO RELATED APPLICATIONS

This application claims the benefit of U.S. Provisional Patent Application Ser. No. 61/991,110, filed on May 9, 2014, and entitled "SYSTEMS AND METHODS FOR MOVING MAGNETIC RESONANCE IMAGING."

BACKGROUND OF THE INVENTION

The field of the invention is systems and methods for magnetic resonance imaging ("MRI"). More particularly, the invention relates to moving MRI systems and methods for their use.

Functional magnetic resonance imaging ("fMRI") provides high spatial resolution mapping of brain activation during various stationary tasks. Today, fMRI is always performed using stationary, earth-horizontal magnets. But the majority of humans and animals spend their active (i.e., non-sleeping) lives upright and moving about. The human nervous system has evolved to function during motion, and performance during motion is required for athletic tasks (e.g., hockey, baseball, gymnastics) as well as for common daily tasks.

Currently existing MRI is practiced with an MRI scanner in which the magnet, RF coil, and other structures of the scanner are fixed in position. If an object or a subject's body or body part is in motion while being scanned, the object, body, or body part must be small enough, or the amplitude of motion must be small enough, to restrict the motion to the confines of these MRI scanner structures.

Today, functional MRI scanning while a human subject is upright, at an arbitrary tilt angle with respect to vertical, moving significantly (e.g., walking, rotating), or some combination of these conditions is impractical or otherwise not possible because of the extreme confinement imposed by existing MRI scanners and—far more importantly—because of the powerful and confounding physical and physiological effects of the magnetic field, especially for large movements of the brain and body relative to the imaging system. As a result, the inability to perform functional MRI of vestibular function and other motion-related functions leaves that part of the human brain map a wholly blank slate.

Although MRI scanners with weak or very weak magnetic fields, such as those generated by permanent magnets or non-superconducting electromagnets, exist and may permit significant motion of an object or subject being imaged, the image quality of such scanners is inadequate for high quality anatomic or functional MRI.

There thus remains a need for an MRI system with a magnet system, whether including a superconducting magnet or permanent magnet, that is capable of imaging a freely moving body, body part, or object, such that studies of naturalistic motions and their associated neural activity can be performed.

SUMMARY OF THE INVENTION

The present invention overcomes the aforementioned drawbacks by providing a moving magnetic resonance imaging (MRI) system that includes a housing having a central bore that is sized to receive a portion of a subject, a magnet assembly that includes at least one magnet, and at least one actuator coupled to the housing and configured to change a position and orientation of the housing. The magnet assembly is securely positioned within the housing.

It is another aspect of the invention to provide a method for acquiring images of a subject using an MRI system having a magnet assembly that is operable while moving or tilted relative to a floor. Data are acquired from a subject using an MRI system having a magnet assembly that is configured to be moved and that remains operable while moving or tilted relative to a floor. The data are acquired while the subject undergoes motion and while the MRI system is operated to move such that a substantially fixed spatial relationship is maintained between the subject and the MRI system. From the acquired data, one or more images of the subject are reconstructed.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

Figure 1:
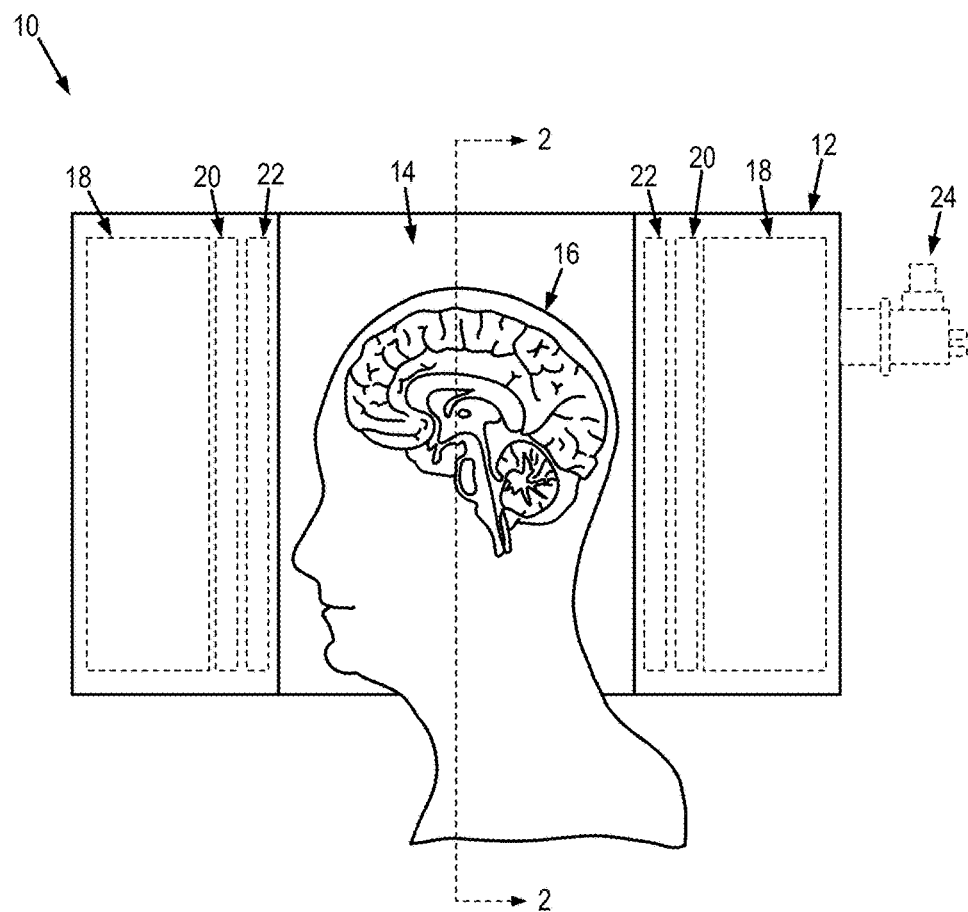
FIG. 1 is an example of a moving magnetic resonance imaging ("mMRI") system in accordance with some embodiments of the present invention.

Described here is a magnetic resonance imaging ("MRI") system that can be operated while a subject performs, experiences, or otherwise undergoes naturalistic motion while keeping the magnet and subject stable with respect to one another. This moving MRI ("mMRI") system allows functional imaging during naturalistic motion, such as passive motion of the head that mimics natural head movements. To enable functional MRI during motion, the magnet assemblies of the mMRI systems described here are configured to move together with the subject's anatomy.

The mMRI systems described here are configured to allow the magnet, RF coil, and other structures of the mMRI scanner to move in a spatial relationship with respect to the body part or object being scanned, thereby uniquely permitting the detection and measurement of gravitational and inertial effects on the body part or object while eliminating or substantially reducing some of the artifactual effects caused by movements of the mMRI scanner magnetic fields relative to the body part or object being imaged. In particular, the systems described here reduce or eliminate the effects of relative motion of the magnetic field with respect to the object or subject being imaged.

The mMRI systems described here are thus distinct from conventional MRI systems, in which scanning a moving body part or object results in an inability to separate the effects of the magnetic fields of the scanner from the effects of gravitation and inertia. The mMRI systems described here are also distinct from conventional MRI systems, in which scanning a large moving body part or object would require an MRI scanner that is much larger in physical extent than existing scanners. Such a large MRI scanner would be impractical to build within the constraints of existing engineering practices and would unaffordable due to the cost of materials such as superconducting wire and liquid helium.

The mMRI system described here provides the ability to perform imaging during motion, which has significant importance for understanding many different brain processes. For instance, movement, including orientation changes relative to gravity, fundamentally affects vision, spatial orientation, cardiovascular function, and balance, as well as numerous other brain processes.

In other application, the mMRI system described here also provides the ability to perform imaging of a static subject, but while the mMRI system is tilted relative to a floor that supports the mMRI system, such that the mMRI system is in a non-parallel orientation with respect to the floor. As an example, the mMRI system can be tilted such that it is oriented at an angle relative to the floor and such that the main magnetic field of the mMRI system is oriented to be non-parallel with the floor. In this configuration, the mMRI system may find application in extremity imaging where it may be desirable to maintain the subject in a static position, but where it would be beneficial to have the subject's extremity oriented at an angle with respect to the ground. For example, it may be more comfortable for a subject to place their leg in an mMRI system that is oriented at an angle with respect to the ground, such that the subject can remain in a more natural sitting posture.

The superconducting magnet assembly used in a conventional MRI system cannot be moved while the scanner is in operation, nor can it be operated in a tilted position, and is thus incapable of imaging a subject during naturalistic motion. Because superconducting magnets have historically used liquid helium (typically at 4K temperature under atmospheric pressure), the magnets must be designed with internal liquid helium vessels and plumbing that manage the liquid cryogen. These systems are typically supported with highly delicate mechanical structures designed to minimize heat leakages into the cold mass of the magnet, which refers to the parts of the magnet (e.g., the assembly of magnet coils, collars, and helium vessel) that need to be cooled by the cryogenic system. Moving the magnet results in sloshing of the liquid, and stress and distortion of the support structure. These in turn result in field instability, increased helium boil-off, and possible damage to the magnet.

By eliminating the use of liquid helium and relying on a cryocooler for initially cooling the magnet and for maintaining it at an operating temperature, the construction of the dewar, or cryostat, can be considerably simplified. Using such a cryogen-free system, it becomes possible to operate the magnet while tilted, while in motion, or both.

The cryocooler is a device analogous to a household refrigerator, except that it uses high-pressure helium gas as its working fluid instead of Freon, and it is able to cool down to cryogenic temperatures. In a cryogen-free magnet, cooling is by direct conduction from the magnet cold mass to the cryocooler, without the liquid helium intermediary.

There are many technical hurdles involved in a successful cryogen-free magnet design, such as designing a robust internal support structure with sufficient thermal isolation, managing the energy of a quench without relying on the thermal conduction and cooling effects of liquid helium, and attenuating the conduction of the cryocooler vibration into the magnet cold mass.

Referring now to FIG. 1, an example of a moving magnetic resonance imaging ("mMRI") system is illustrated. The mMRI 10 system generally includes a housing 12 having a bore 14 that is sized to receive a subject 16 for imaging. The housing 12 generally contains a magnet assembly 18, one or more gradient coils 20, and one or more radio frequency ("RF") coils 22. As will be described below, the magnet assembly 18 may be maintained at an operating temperature by way of a cryocooler 24; however, some configurations of the mMRI system 10 may not need a cryocooler, or may use an alternative system for maintaining the magnet assembly 18 at an operating temperature, as mentioned below.

In general, the magnet assembly 18 includes at least one magnet, which may be a superconducting magnet or a permanent magnet. In some embodiments, the magnet assembly 18 includes at least one superconducting magnet that is maintained at an operating temperature using a cryocooler that does not use a liquid cryogen. In some other embodiments, the magnet assembly 18 may include a superconducting magnet that can operate at higher temperatures than current systems, thereby allowing the design and construction of a simpler dewar that can be moved, tilted, and otherwise rotated during imaging while still using a liquid cryogen. As one example, such a magnet assembly 18 may include a superconducting magnet that can be maintained at an operating temperature using liquid nitrogen rather than liquid helium as a cryogen.

As mentioned above, some other embodiments of the mMRI system 10 can include a magnet assembly 18 that includes one or more permanent magnets, rather than superconducting magnets. In this configuration, the permanent magnets are preferably capable of generating a magnetic field with a field strength similar to conventional, clinical superconducting magnet systems, including 1.0 T.

Figure 2:
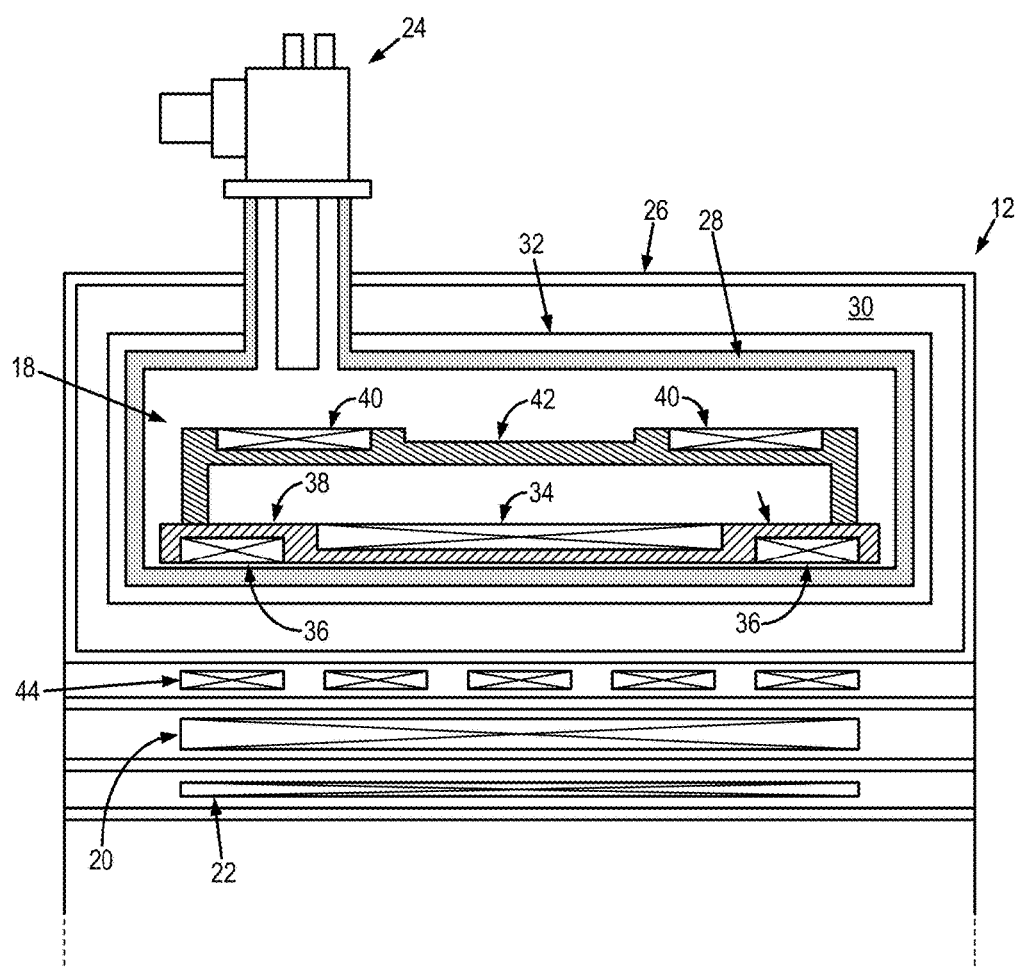
FIG. 2 is a cross section of the mMRI system of FIG. 1.

Referring now to FIG. 2, the housing 12 may be constructed of an outer housing 26 and an inner housing 28. As such, the housing may also be referred to as a dewar or cryostat. A vacuum 30 is provided between the outer housing 26 and the inner housing 28. The inner housing 28 contains the magnet assembly 18. The inner housing 28 may optionally be enclosed in a thermal shield 32 to further reduce thermal losses in the cold mass of the magnet assembly 18.

The magnet assembly 18 generally includes a main magnet coil 34 and one or more field compensation coils 36, both of which are coupled to a common support 38, or bobbin. The magnet assembly 18 may also include one or more active shielding coils 40, which may be coupled to a second support 42, or bobbin. To achieve high homogeneity the mMRI system 10 can have one or more passive shims 44 embedded in the housing. As an example, the passive shims can include ferromagnetic shims. The housing also contains one or more gradient coils 20 and one or more RF coils 22. As one example, the magnet assembly 18 can be designed to generate a 3 T magnetic field using a cryogen-free superconducting magnet that is capable of operating in a static tilt or while in motion. In other configurations, the magnet assembly 18 can be designed to generate magnetic fields of other strengths, including those commonly used by clinical MRI systems, such as 1.5 T.

The interior of the inner housing 28, and thus the magnet assembly 18, is maintained at an operating temperature by the cryocooler 24, which may include a pulse tube cryocooler, a Gifford-McMahon ("GM") cryocooler, or any other suitable cryocooler, including those whose operation is not orientation dependent. As an example, the operating temperature can be less than 6 K, such as 4 K. In some other embodiments, however, the operating temperature may be higher, such as in the range of temperatures for solid nitrogen (below 63 K), or liquid nitrogen (e.g., around 77 K), or higher.

In general operation, the cryocooler may include compressing room temperature helium gas, which is supplied to a refrigerator where the compressed gas cools by expansion. The cooling helium gas then cools heat stations on the refrigerator, thereby cooling the refrigerator and the interior of the inner housing 28. The gas is then returned to the compressor to repeat the cycle.

Figure 3:
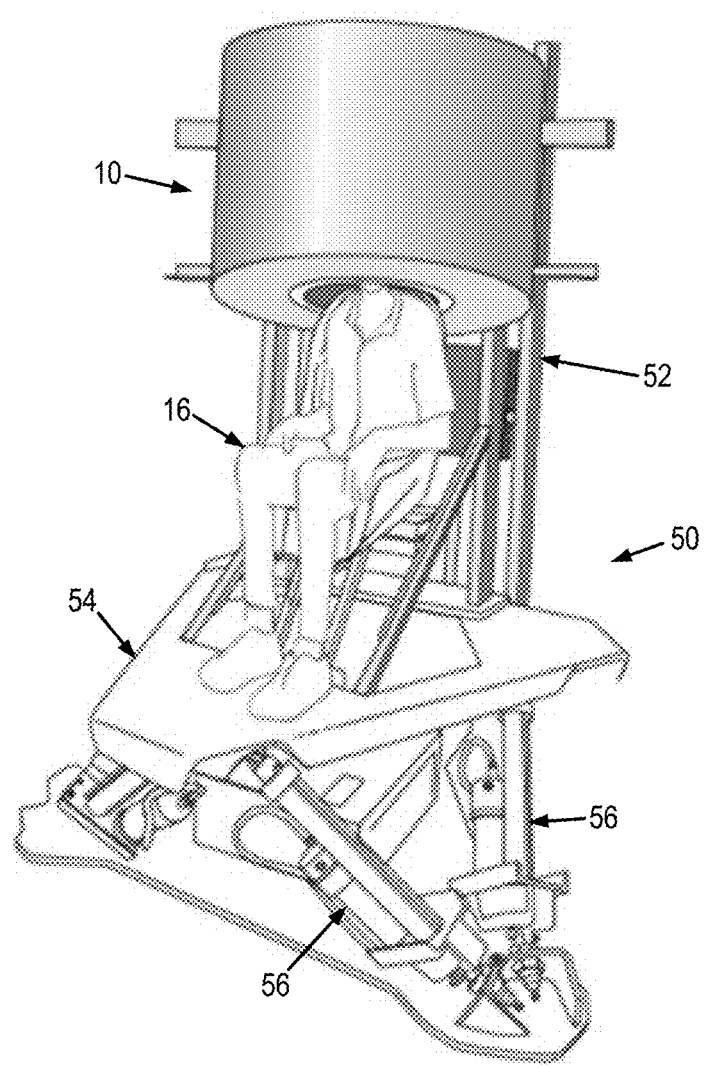
FIG. 3 is an example of one embodiment of an mMRI system, in which the magnet is coupled to a movable platform.

Referring now to FIG. 3, in some embodiments the mMRI system 10 can be integrated with a motion system 50 that includes a movable support 52 coupled to a motion platform 54. A series of actuators 56 operably engage the motion platform 54 and the movable support 52. When they are actuated, the actuators 56 cause the mMRI system 10 to move in a fixed relation to the subject 16 being imaged. Both the mMRI system 10 and subject 16 seated in the chair are rigidly attached to the motion platform 54 and to each other during motion. The platform 54 can thus move the subject 16 in each of the possible six degrees-of-freedom by way of appropriate actuation of the series of actuators 56. This mMRI system is well-suited for imaging of brain motion (using MRI) and brain activation (using fMRI) during naturalistic motion (i.e., motion that mimics natural active movements). As one example, the motion platform 54 may be a Moog motion base (Moog, Inc.; East Aurora, N.Y., USA).

In some embodiments, the mMRI system can be combined with simultaneous multichannel EEG, which allows for simultaneous measurements of neuronal activity with the high temporal resolution of EEG and the high spatial resolution of functional MRI. Recent major advances in the safety of EEG electrodes in the MRI environment combined with MRI artifact removal have made this combined method practical, thereby offering the possibility of constrained simultaneous reconstruction of the EEG sources using fMRI spatial information. fMRI-informed EEG source reconstruction utilizes the relatively high spatial resolution and soft tissue detail inherent in anatomic and functional MR to spatially constrain the inversion of EEG raw data, yielding a higher resolution electrical source map.

Figure 4:
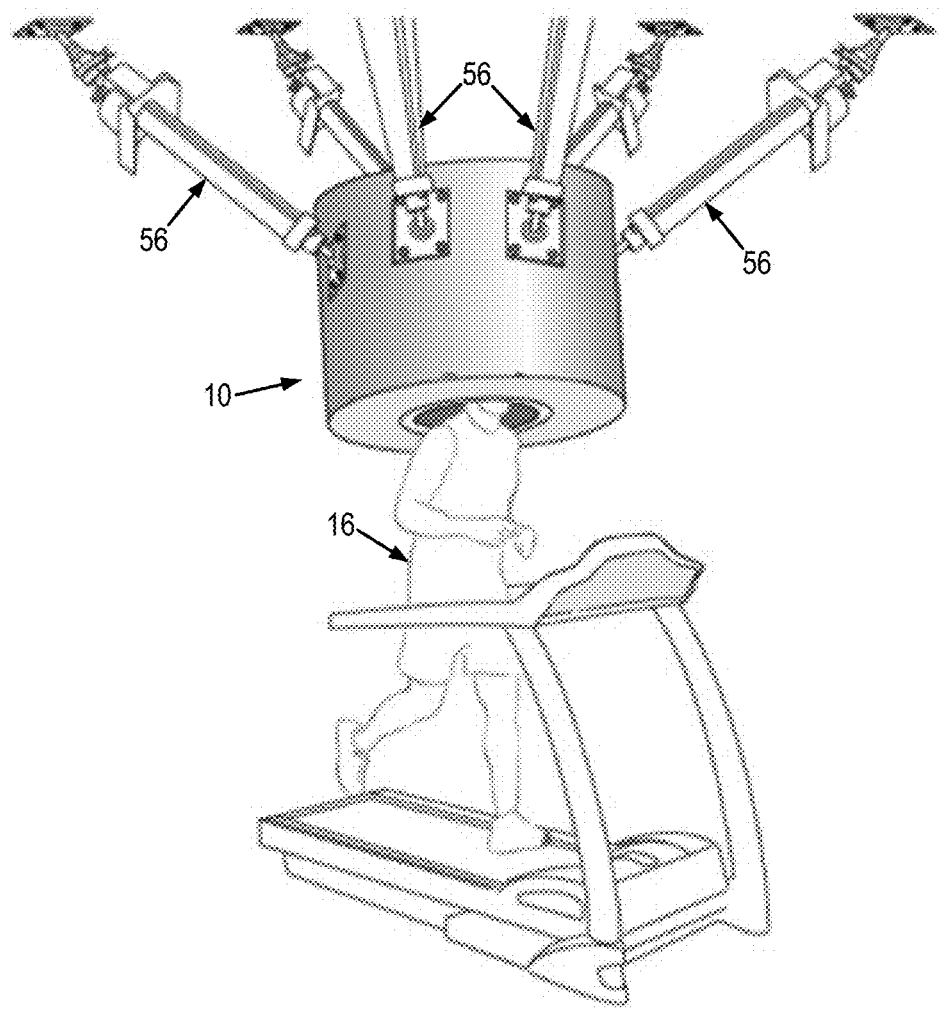
FIG. 4 is an example of another embodiment of an mMRI system, in which the magnet is coupled to actuating arms.

Referring now to FIG. 4, in some other embodiments, the mMRI system 10 can be coupled to a series of actuators 56 that can be coupled to a support frame (not shown) or to the scanner room, such as to the ceiling or walls. By way of example, in this configurations, the actuators 56 can be compliant robots, such as those developed and marketed by Meka Robotics. As shown, this configuration of the mMRI system 10 can be used for MRI imaging during active naturalistic motion of the subject 16.

In some embodiments, head motion feedback, force feedback, and torque feedback can be provided to the mMRI system 10 and this feedback used to move the mMRI system 10 in coordination with the subject 16 such that a substantially fixed relation is maintained between the mMRI system 10 and subject 16. In some embodiments, this feedback may be provided by a bite bar or the like.

In some other embodiments, the mMRI system 10 can be coupled to motion systems other than those that implement translational actuators. For instance, in some configurations the mMRI system 10 can be coupled to a rotator to provide rotation about a longitudinal axis of the mMRI system 10. The mMRI system can also be coupled to a gantry or other motion system that provides rotation of the mMRI system 10 through different angles relative to a vertical or horizontal axis. In general, it will be appreciated that any suitable combination of rotational and translational actuators or other motion systems could be combined in a large variety of combinations to yield motion in 1-6 degrees-of-freedom.

Because the imaging of neuronal activation with functional MRI often requires the subtraction of two images, in effect measuring a small difference between two relatively large numbers, motion of the head during the interval separating the two image acquisitions will result in an erroneous subtraction (i.e., a motion artifact). Despite the best efforts to hold the head motionless with respect to the MRI scanner while the scanner is in motion, residual displacement of the head in the scanner will undoubtedly occur, necessitating the use of motion artifact reduction measures. Even if the skull is held rigidly fixed within the scanner, the brain will move and distort within the brain case. Therefore, the mMRI system described here will benefit from robust motion artifact reduction techniques.

Even in fixed magnets with cooperative volunteers who are instructed to lie motionless, there can be small head motions during MRI of the brain, especially during longer and high resolution acquisitions. Patients and children and elderly persons are more likely to move during imaging.

In the mMRI systems described here, despite the fact that the entire system moves with the subject, there may still be small residual changes in position between the subject and the magnet. Even with perfect spatial registration of the skull to the magnet, as would be the case with a rigidly mounted stereotactic frame, the brain itself moves and deforms within the skull to an extent limited by the braincase.

Motion causes incorrect spatial encoding, with resultant blurring, ghosting, and other artifacts, depending on the acquisition type. These artifacts can be mitigated by real-time tracking and correction of the image encoding. That is, if a source of real-time position information is available, the mMRI system can adjust spatial encoding to track along with subject motion. Changes in position also induce changes in the magnetic field due to varying head and brain tissue magnetic susceptibility. The magnetic field inhomogeneities are carefully corrected by shimming at the start of the scan session, but this correction is invalid if the person's head position changes. If a source of real-time magnetic field information is available, the MRI system can adjust the shims (including the field or frequency offset and higher order terms) as the subject moves. Similarly, as the head moves within the sensitivity profile of an RF coil array, the sensitivity map must be adjusted. This is especially important when parallel acceleration is employed.

In some embodiments, dynamic position information can be provided by an external tracker system, such as one that uses inductive sensors, optical tracking with markers and cameras, or tracking with RF markers. As one example, an EndoScout motion tracking system (Robin Medical, Inc.; Baltimore, Md.), which uses an inductive sensor, could be integrated with the mMRI system.

An example inductive sensor system uses the voltages induced in a set of three pairs of orthogonally arranged coils to derive the pose (position and orientation) of the sensor. The sensor is very small and can be readily affixed to the subject's head. The pose information is requested by the scanner at frequent intervals (e.g., multiple times per second) and used to adapt the gradients and RF pulse offset frequencies to track the subject in real time. Updates are applied rapidly and can be used to correct pulse sequences on a slice-by-slice basis.

As another example of external motion tracking, subject tracking may be performed with an array of small MR sensors ("microcoils") affixed to the subject. These microcoil sensors could be wired or inductively coupled (i.e., "wireless") RF microcoils for motion artifact reduction. With the appropriate frequency-encoding readouts built into the pulse sequence, the coils act as position sensors that can be rapidly interrogated (e.g., on the order of 10 ms update intervals). Three coils can be sufficient to define small displacements and rotations of a rigid body such as the skull. More coils can be added for increased accuracy or to sense more complex motion fields. Wireless coils have the advantage that they may all be detected with a single receiver channel, and are therefore well-suited for use in the mMRI scanner.

In some other embodiments, dynamic motion information can be provided by intrinsic navigator tracking. As one example of this approach, the pulse sequence used by the mMRI system is either inherently self-navigating, including sections that can be converted into "snapshots" of the subject's anatomy and registered to one another to gauge any changes in body position. As another example of this approach, an intrinsic navigator is added to a data acquisition scheme in order to obtain pose information at frequent intervals. As with external trackers, the pose information is used to drive spatial encoding in real time and, thus, track the subject's anatomy as it moves.

One example of a navigator that can be used to acquire dynamic motion information is the cloverleaf navigator, which is an extremely short (e.g., about 3 ms) pulse sequence element that may be used to estimate head pose and provide a correction as often as every 10 ms in a FLASH sequence. This navigator provides full six degrees-of-freedom estimates of position with a single k-space navigator, as well as frequency and linear shim information. Earlier navigator approaches, such as orbital navigators and spherical navigators, provide a subset of this information, but could also be used albeit to acquire less dynamic motion information.

As still another example, object-space navigators may be used to obtain snapshots of the head position. For instance, 3D EPI-based volumetric navigators ("vNavs") can be used for tracking motion in an MPRAGE pulse sequence. These navigators require around 300 ms to acquire and around an additional 60 ms to register to the first reference navigator, but they are accurate and precise. If two different echo times are interleaved, a 3D field map may be acquired. These field maps can be used for real-time prospective shimming along with motion correction. Real-time shimming may prove useful for the mMRI application to maintain the homogeneity of the magnetic field by compensating for the degradation of the static field uniformity caused by residual displacements or motion of the subject with respect to the magnet.

In principle, the 3D navigator may also be used to estimate B1 field maps (e.g., coil sensitivity maps) if coil switching between a single channel transmit/receive birdcage coil and a multichannel array coil is used.

Pulse sequences can also be modified to make them inherently less sensitive to specific types of motion. Image errors due to motion occur when nuclear spins move along the direction of a field gradient, and therefore acquire a spurious signal phase that is not refocused at the peak of the spin or gradient echo because the positions of the spins are different during the dephasing and rephasing segments of the echo. Static spins rephase well, whereas moving spins do not.

Using appropriate balancing of the positive and negative lobes of the gradient waveform, however, it is possible to force spins with fixed velocities (including static, or zero velocity) to refocus. This is known as gradient moment nulling. Higher order moments of motion (i.e., acceleration, jerk, etc.) may be moment nulled with higher order balancing of gradient waveforms. An advantage of gradient moment nulling is that no additional hardware is required for this technique to work, but only the lowest order moments may be practical for nulling.

It is contemplated that the imaging capability provided by the mMRI system described here can allow a better understanding of the brain circuits that respond during natural motion. Performing spatial imaging using functional MRI ("fMRI") during motion is a highly innovative scientific approach that will help map the brain circuitry that underlies natural brain function during motion. A non-limiting list of possible clinical and scientific applications of this technology includes providing a better understanding of the neural circuits that contribute to motion sickness, vestibular function, motor control, sensorimotor integration, sensory conflict, cardiovascular function, learning, and active sensing, such as vision during motion of head and eyes. This mMRI system can also be used to provide a better understanding of autonomic function as well as most aspects of sensory-somatic function.

As one of many examples, the mMRI system can be utilized to provide unique information pertaining to vestibular function. The vestibular system is the part of the inner ear that contributes directly to sensations of tilt, translation, and rotation. In parallel, the vestibular system contributes to fundamental reflexive responses like posture control ("balance"), which enables human bipedal locomotion, and the vestibulo-ocular reflex that rotates the eye in the skull to help stabilize the eyes in space.

Vestibular imaging today is performed using highly unnatural stimuli (e.g., caloric, galvanic, loud sounds) that yield conflicting information between two or more sensory systems (i.e., "sensory conflict"). Most natural motions do not evoke conflict between the senses because all the sensory systems (including the five vestibular organs) naturally respond to the same motion. While unnatural stimuli tell us something about brain activation during vestibular stimuli, they cannot mimic the rich sensory interactions that occur naturally, nor can these unnatural stimuli isolate rotation, translation, and tilt. Artificial stimulation is also incapable of distinguishing sensory processing from sensory conflict. The mMRI system described here, however, facilitates natural functional imaging of the vestibular system and, hence, can provide a unique understanding of how the brain normally processes vestibular information alongside other natural motion information and how patients with vestibular disorders process vestibular information.

Other applications of the mMRI system include orthopedic imaging, including scanning joints or the spin with and without gravity loading; studies of cardiac energetics with the patient both upright and supine; pulmonary studies with the patient both upright and supine; and veterinary imaging, including imaging the extremities of large mammals, such as horses.

As stated above, the mMRI system can enable measurements that can provide information on how the human brain functions naturally during motion. The ability to perform imaging during motion has significant importance. Movement, including orientation changes relative to gravity, fundamentally affects vision, spatial orientation, cardiovascular function, and balance, as well as numerous other brain processes.

In addition, the mMRI system can also enable measurement of the motion of the brain relative to the skull during natural head motion. These measurements can provide information on how the brain moves and distorts during head impact and during naturalistic movement, which is important for interpreting EEG signals during head motion. Knowing how the brain moves could also enable a better understanding and diagnosing of traumatic brain injury ("TBI"), which could lead to improved TBI prophylactics and preventatives (e.g., improved restraints and/or helmet design).

The present invention has been described in terms of one or more preferred embodiments, and it should be appreciated that many equivalents, alternatives, variations, and modifications, aside from those expressly stated, are possible and within the scope of the invention.

The invention claimed is:

1. A moving magnetic resonance imaging (MRI) system, comprising:
    a housing having a central bore sized to receive a portion of a subject;
    a magnet assembly for imaging comprising at least one magnet, the magnet assembly being securely positioned within the housing; and
    at least one actuator coupled to the housing and configured to change a position and orientation of the housing;
    wherein the at least one actuator is configured to change at least one of the position or orientation of the housing while magnetic resonance imaging of the subject is occurring and at least one of the position or orientation of the subject is changing during the magnetic resonance imaging,
    wherein the change in at least one of the position or orientation of the housing maintains a substantially fixed spatial relationship between the subject and the magnet assembly.

2. The moving MRI system as recited in claim 1, further comprising a movable platform that is coupled to the housing by the at least one actuator such that actuation of the actuator changes a position and orientation of the platform in a fixed relation to the position and orientation of the housing.

3. The moving MRI system as recited in claim 2, further comprising a support coupled on one end to the housing and on another end to the movable platform.

4. The moving MRI system as recited in claim 1, wherein the at least one magnet is a superconducting magnet.

5. The moving MRI system as recited in claim 4, further comprising a cryocooler coupled to the housing and configured to maintain an interior volume of the housing at an operational temperature, wherein the magnet assembly is contained in the interior volume.

6. The moving MRI system as recited in claim 5, wherein the magnet assembly does not use liquid cryogens.

7. The moving MRI system as recited in claim 1, wherein the magnet assembly further comprises at least one magnetic field compensation coil.

8. The moving MRI system as recited in claim 1, wherein the magnet assembly further comprises at least one active shielding coil.

9. The moving MRI system as recited in claim 1, further comprising an inner housing contained within the housing, and wherein the magnet assembly is securely positioned within the inner housing, and a vacuum exists between the housing and the inner housing.

10. The moving MRI system as recited in claim 9, further comprising at least one gradient coil securely positioned within the housing.

11. The moving MRI system as recited in claim 9, further comprising at least one radio frequency (RF) coil securely positioned within the housing.

12. The moving MRI system as recited in claim 9, further comprising a thermal shield disposed on an outer surface of the inner housing.

13. The moving MRI system as recited in claim 1, wherein the central bore of the housing is configured to securely receive the portion of the subject's anatomy such that the portion of the subject's anatomy is maintained in a substantially fixed relation with the housing as the position and orientation of the housing is changed.

14. The moving MRI system as recited in claim 1, wherein the portion of the subject's anatomy is a head.

15. The moving MRI system as recited in claim 1, wherein the portion of the subject's anatomy is an extremity.

16. A method for acquiring images of a subject using a magnetic resonance imaging (MRI) system having a magnet assembly that is operable while at least one of moving or tilted relative to a floor, the steps of the method comprising:
    (a) acquiring data from a subject using an MRI system having a magnet assembly for imaging that is configured to remain operable while at least one of moving relative to a floor or tilted relative to the floor, wherein the MRI system is located on the floor;
    (b) operating the magnet assembly to move such that a substantially fixed spatial relationship is maintained between the subject and the magnet assembly while the subject is in motion, wherein step (b) occurs during at least part of step (a); and
    (c) reconstructing an image of the subject from the acquired data.

17. The method as recited in claim 16, wherein operating the MRI system to move such that a substantially fixed spatial relationship is maintained between the subject and the MRI system comprises providing feedback about the subject's motion to the MRI system.

18. The method as recited in claim 17, wherein the feedback about the subject's motion includes at least one of motion feedback, force feedback, and torque feedback.

19. The method as recited in claim 16, wherein operating the MRI system to move such that a substantially fixed spatial relationship is maintained between the subject and the MRI system includes operating at least one actuator that is coupled to the MRI system.

20. The method as recited in claim 16, wherein step (c) includes determining a residual relative displacement between the subject and the MRI system and reducing an effect of the residual relative displacement at least one of before or after reconstructing the image of the subject.

* * * * *

UNITED STATES PATENT AND TRADEMARK OFFICE
CERTIFICATE OF CORRECTION

PATENT NO.        : 10,222,444 B2
APPLICATION NO.   : 14/707606
DATED             : March 5, 2019
INVENTOR(S)       : Daniel Merfeld et al.

Page 1 of 1

It is certified that error appears in the above-identified patent and that said Letters Patent is hereby corrected as shown below:

In the Specification

Column 7, Line 40, "("vNays")" should be --("vNavs")--.

Signed and Sealed this
Fourteenth Day of May, 2019

Andrei Iancu
*Director of the United States Patent and Trademark Office*